United States Patent
Wu et al.

(10) Patent No.: US 6,770,572 B1
(45) Date of Patent: Aug. 3, 2004

(54) USE OF MULTIFUNCTIONAL SI-BASED OLIGOMER/POLYMER FOR THE SURFACE MODIFICATION OF NANOPOROUS SILICA FILMS

(75) Inventors: Hui-Jung Wu, Fremont, CA (US); James S. Drage, Fremont, CA (US)

(73) Assignee: AlliedSignal Inc., Morristown, NJ (US)

( * ) Notice: Subject to any disclaimer, the term of this patent is extended or adjusted under 35 U.S.C. 154(b) by 418 days.

(21) Appl. No.: 09/488,075

(22) Filed: Jan. 20, 2000

Related U.S. Application Data

(60) Provisional application No. 60/117,248, filed on Jan. 26, 1999.

(51) Int. Cl.[7] .................. H01L 21/31; H01L 21/469
(52) U.S. Cl. .................. 438/778; 438/780; 438/787; 438/789
(58) Field of Search .................. 438/778, 780, 438/781, 782, 784, 787, 789

(56) References Cited

U.S. PATENT DOCUMENTS

| | | | |
|---|---|---|---|
| 4,072,796 A | | 2/1978 | Reinhardt et al. .......... 428/405 |
| 4,789,564 A | * | 12/1988 | Kanner et al. .............. 430/110 |
| 4,885,262 A | | 12/1989 | Ting et al. .................. 437/231 |
| 5,013,585 A | * | 5/1991 | Shimizu et al. ............. 427/220 |
| 5,162,155 A | * | 11/1992 | Berndt et al. ............... 428/405 |
| 5,470,802 A | * | 11/1995 | Gnade et al. ............... 438/781 |
| 5,661,344 A | | 8/1997 | Havemann et al. ......... 257/758 |
| 5,723,368 A | | 3/1998 | Cho et al. ................... 437/763 |
| 5,789,819 A | | 8/1998 | Gnade et al. ............... 257/759 |
| 5,798,144 A | * | 8/1998 | Varanasi et al. ............ 427/384 |
| 5,801,092 A | | 9/1998 | Ayers .......................... 438/623 |
| 5,804,508 A | | 9/1998 | Gnade et al. ............... 438/778 |
| 5,807,607 A | | 9/1998 | Smith et al. .................. 427/96 |
| 5,936,295 A | | 8/1999 | Havemann et al. ......... 257/522 |
| 5,955,140 A | | 9/1999 | Smith et al. .................. 427/96 |
| 6,037,277 A | * | 3/2000 | Masakara et al. ........... 438/787 |
| 6,063,714 A | * | 5/2000 | Smith et al. ................ 438/778 |
| 6,171,645 B1 | * | 1/2001 | Smith et al. .................. 427/96 |
| 6,208,014 B1 | * | 3/2001 | Wu et al. .................... 257/629 |

FOREIGN PATENT DOCUMENTS

| | | |
|---|---|---|
| EP | 0 688 052 | 12/1995 |
| EP | 0 849 796 | 6/1998 |
| SU | RU-2089499 C1 * | 9/1997 |

* cited by examiner

*Primary Examiner*—Kamand Cuneo
*Assistant Examiner*—Asok Kumar Sarkar
(74) *Attorney, Agent, or Firm*—Roberts & Roberts, LLP

(57) ABSTRACT

A process for treating a silica film on a substrate, which includes reacting a suitable silica film with an effective amount of a surface modification agent, wherein the silica film is present on a substrate. The reaction is conducted under suitable conditions and for a period of time sufficient for the surface modification agent to form a hydrophobic coating on the film. The surface modification agent includes at least one type of oligomer or polymer reactive with silanols on the silica film. Dielectric films and integrated circuits including such films are also disclosed.

19 Claims, No Drawings

USE OF MULTIFUNCTIONAL SI-BASED OLIGOMER/POLYMER FOR THE SURFACE MODIFICATION OF NANOPOROUS SILICA FILMS

CROSS REFERENCE TO RELATED APPLICATION

This patent application is a continuation-in-part of, and claims the benefit of provisional application Ser. No. 60/117,248, filed on Jan. 26, 1999, the disclosure of which is incorporated by reference herein in its entirety.

FIELD OF THE INVENTION

The present invention relates to low dielectric constant silica films and to improved processes for producing the same on substrates suitable for use in the production of semiconductor devices, such as integrated circuits ("ICs").

BACKGROUND OF THE INVENTION

As feature sizes in integrated circuits (ICs) approach 0.18 microns and below, it is believed that electrical insulation layers having a dielectric constant $\leq 2.5$ will be required for interlevel dielectric (ILD) and intermetal dielectric (IMD) applications.

Nanoporous Silica Films

One material with a low dielectric constant ("k") is nanoporous silica, which can be prepared with relatively low dielectric constants, by the incorporation of air, with a k of 1, in the form of nanometer-scale pores. Nanoporous silica is attractive because it employs similar precursors, including organic-substituted silanes, e.g., tetramethoxysilane ("TMOS") and/or tetraethoxysilane ("TEOS"), and/or methyltriethoxysilane, as are used for the currently employed spin-on-glasses ("SOG") and chemical vapor deposition ("CVD") of silica ($SiO_2$). Nanoporous silica is also attractive because it is possible to control the porosity, and hence the density, material strength and dielectric constant of the resulting film material. In addition to a low k, nanoporous silica offers other advantages including: 1) thermal stability to 500° C., 2) substantially small pore size, i.e. at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional SOG processing.

One difficulty associated with nanoporous silica films is the presence of polarizable functional groups on internal pore surfaces. Functional groups present in previously available nanoporous films include silanol (SiOH), siloxane (SiOSi), alkoxy (SiOR), where R is an organic species such as, but not limited to, a methyl, ethyl, isopropyl, or phenyl groups, or an alkylsilane (SiR), where R is as defined previously. In particular, silanol groups are highly polarizable and hygroscopic. Since nanoporous silica has a relatively large (internal) surface area associated with its porous structure, the contribution of the highly polarizable silanol groups results in higher than desired dielectric constant values. Adsorption of environmental water by the silanol groups can potentially raise the dielectric constant of such materials even further.

Even if the dielectric film is out-gassed by heating before subsequent processing, the presence of the polar silanols can contribute negatively to the dielectric constant and dielectric loss. Previously employed methods for overcoming this limitation and rendering the internal pore surfaces of nanoporous silica less polarizable and less hydrophilic include reacting the internal surface silanols with surface modifying agents, also referred to in the art as silylation agents or capping agents. Such capping agents include, e.g., chlorosilanes or disilazanes.

In one previously employed method of capping silanol groups on pore surfaces, an organic reagent such as hexamethyldisilazane (HMDZ) is introduced into the pores of the film and allowed to react with the surface silanol groups to cap the silanols by forming trimethylsilyl groups. These silylated surface groups are significantly less polarizable than the original silanols, and render the pore surfaces of the film hydrophobic. One disadvantage in the use of trimethylsilyl groups is that they are not very thermally stable and may out-gas during processing of the IC and cause via poisoning.

Another critical parameter of a nanoporous silica film is its mechanical strength. Generally the mechanical strength of a material decreases in proportion to any decrease in density in that material. For a nanoporous film to be useful as a dielectric film in IC devices, it is important that the combination of mechanical strength and low dielectric constant be optimized. For a given dielectric constant (which is proportional to refractive index and density), the density is fixed, at least for a specific chemical composition. With fixed density, the strength of the nanoporous silica is maximized by having the greatest fraction of solid within the skeleton of the film rather than as appended chemical groups on the surfaces of the nanometer-scale pores. Thus, in another drawback, reagents such as HMDZ introduce a significant additional mass, in the form of trimethylsilyl groups, to the pore surfaces. The disproportionate mass of the trimethylsilyl groups is not available to contribute to mechanical strength, but it does raise the density of the film and therefore is an obstacle to achieving the lowest possible k.

For these reasons, and in view of the need for rapid competitive advances in the art of semiconductor, and/or microprocessor or IC fabrication, there remains a constant need in the art to improve upon previous methods and materials. In particular, there is a need to provide silica dielectric films with hydrophobic surfaces, and in particular to provide nanoporous silica films with hydrophobic pore surfaces, while desirably enhancing the mechanical strength of such treated hydrophobic films. The successful solution of this problem will provide greater material film strength for a given desired dielectric constant.

SUMMARY OF THE INVENTION

Surprisingly, the methods of the present invention are able to solve these and other problems in the art by providing surface modification agents that are able to render treated silica dielectric films hydrophobic while also enhancing the mechanical strength of the treated films, relative to previously employed methods and agents or reagents.

Accordingly, the invention provides novel processes for forming silica dielectric films or coatings on a desired substrate by the steps of reacting a suitable silica film with a surface modification agent. The silica film is present on a substrate, and the reaction is conducted under suitable conditions, and for a period of time sufficient for the surface modification agent to form a hydrophobic coating on the silica dielectric film. The surface modification agent comprises at least one type of oligomer or polymer reactive with silanols on the silica film. Compositions, including silica dielectric films and integrated circuits with at least one silica dielectric film treated by the processes of the invention are also provided. The processes of the invention are unexpectedly applied to silica dielectric films without significantly degrading the obtainable range of desirable dielectric values.

Optionally, the silica film is pretreated with a monomer-type surface modification agent that can cap or silylate silanols in the dielectric film surface. In a further option, the silica film is treated with a composition that includes both an oligomer or polymer surface modification agent and a monomer-type surface modification agent.

The silica dielectric film to be treated may be non-porous, but is preferably a nanoporous silica film prepared on the substrate immediately prior to the time of treatment, or may be previously prepared and stored or obtained from another source. It should also be mentioned that the silica dielectric films to be treated by the novel processes of the invention are optionally aged or gelled, although this is not required. If an aging step is employed, it can be conducted before or after application of the surface modification treatment as described herein, but preferably, the film is aged prior to surface modification.

The processes of the invention may be conducted in either a vapor phase or a liquid phase, as desired. Further, the processes are optionally conducted in the presence of a solvent or co-solvent, and it should be appreciated that when the surface modification is to be conducted in the liquid phase, the solvent or co-solvent is effective to dissolve and/or suspend the surface modification agent or agents without significantly dissolving the film to be treated.

Any suitable material may be employed as a solvent or co-solvent, including both ketones and non-ketones, but preferably, such solvent or co-solvent is selected from the group consisting of ethers, esters, ketoses, glycol ethers, chlorinated solvents, low viscosity siloxanes, and suitable combinations thereof.

While the silica film to be treated need not be porous, preferably, the film to be treated is a nanoporous dielectric film having a pore structure with a high surface area, and the surface modification process is conducted for a period of time sufficient for the surface modification agent to surface modification agent to effectively coat the surface of the film and to produce a treated nanoporous silica film having a dielectric constant of about 3 or less. Preferably, the surface modification reaction is conducted for a time period ranging from about 10 seconds to about 1 hour and at a temperature ranging from about 10° C. to about 300° C.

Preferably the film to be treated is on a substrate, e.g., a wafer suitable for production of an integrated circuit.

The invention also provides for dielectric films and an integrated circuit or circuits that include at least one dielectric film produced by the processes of the invention. Preferably, dielectric silica-based films produced by the inventive processes reveal no significant silanol absorbance in the wavelengths ranging from about 3200 to about 3700 $cm^{-1}$ under Fourier transform infrared spectroscopy.

DETAILED DESCRIPTION OF THE PREFERRED EMBODIMENT

Accordingly, in contrast to previously reported methods for rendering silica dielectric films and materials hydrophobic, the present invention provides for polymer and/or oligomer-based reagents for surface modification treatment. This approach has a number of advantages over previous methods. In particular, surface modification using a polymer-based reagent will provide improved mechanical strength, relative to previously employed reagents. Without wishing to be bound by any hypothesis or theory as to how the inventive reagents might operate, it is believed that weakest part of the fine structure of a nanoporous silica film is the contact point between the particles or grains of the film. Thus, a polymer coating on the film surface, particularly a coating on the surfaces of the nanometer-scale pores, is believed to both eliminate the moisture absorbing problem, and to strengthen the mechanical properties of the film, by overcoating and binding together the fine particles or grains that make up the film. Whatever the underlying reasons for the positive effect on film mechanical strength, the examples provided hereinbelow confirm that the methods and reagents of the invention in fact provide enhanced film strength.

The processes and reagents of the invention are applied to silica dielectric films. A number of methods for the preparation of nanoporous silica films on substrates are known to the art, as summarized in the "Background of the Invention", above. In addition, a number of variations and improvement to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, as well as co-owned U.S. patent application Ser. No. 09/379, 484, filed on Aug. 23, 1999, Ser. No. 09/392,413, filed on Sep. 9, 1999, the disclosures of which are incorporated by reference herein in their entireties. In any event, the artisan will appreciate that the methods and materials of the invention are readily applied to a wide variety of art-known dielectric materials, including organic-based dielectric materials, and preferably, to silica-based dielectric materials, and most preferably to nanoporous dielectric silica materials, to provide for enhanced strength and/or a protective hydrophobic coating.

In order to better appreciate the scope of the invention, it should be understood that unless the "$SiO_2$" functional group is specifically mentioned when the term "silica" is employed, the term "silica" as used herein, for example, with reference to dielectric films, is intended to refer to dielectric films prepared by the inventive methods from an organic or inorganic glass base material, e g., any suitable silicon-based material. In addition, it should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired.

Further, the use of the terms, "agent" or "agents" herein should be considered to be synonymous with the terms, "reagent" or "reagents," unless otherwise indicated. Use of the term "integrated circuit," or "IC," is intended to represent any semiconductor product for which the processes and compositions of the invention are employed, unless otherwise specified.

Further still, although the description provided herein generally describes processes employed for treating nanoporous dielectric materials, the artisan will readily appreciate that the instantly provided methods and compositions are readily applied to nonporous dielectric silica films as well. Thus, nonporous films applied to a suitable substrate, e.g., a semiconductor wafer suitable for producing an integrated circuit, as described below, will also benefit from the methods and materials provided by the present invention. For example, adsorption of environmental water vapor onto hydrophilic silica films employed as insulators and the like in fabricating integrated circuits will cause problems such as an excessively high dielectric constant, current leakage and via poisoning. These additional problems are solved by the methods and compositions of the invention.

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by any methods, e.g., including, but not limited to, the art-known methods of spin-coating, chemical vapor deposition or CVD, and dip-coating. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("SiO$_2$") and mixtures thereof. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 microns or less, preferably 1 microns or less, and more preferably from about 0.05 to about 1 microns. Other optional features of the surface of a suitable substrate include previously formed nanoporous silica dielectric films The starting materials for conducting the processes of the invention also include a nanoporous silica film formed on the substrate by applying a silica precursor, such as a spin-on glass composition onto the substrate and then optionally aging the film. If an aging step is applied, this is typically conducted, for example, by treating the coated substrate with, e.g., ammonia and water vapor, to promote gelation.

Generally, the processes of the invention are conducted on the nanoporous film while it is still wet film, directly after aging. In alternative embodiments, the processes of the invention are optionally conducted on nanoporous silica films not yet subjected to aging, to dried nanoporous films and to nanoporous silica films that have been stored for a time period after completing the aging process.

While a number of alternative aging methods are known to the art, preferably, in the processes of the invention, the film is aged by treatment with ammonium hydroxide. As exemplified hereinbelow, the film is aged statically by exposing the film-bearing substrate to 15M ammonium hydroxide and water vapor in a confined chamber for a time period and under conditions effective to allow the water and ammonia vapor to diffuse into the film.

Polymeric/Oligomeric Surface Modification Compositions

In order to optimize the density/dielectric constant parameters together with the need for sufficient mechanical strength, the invention provides a surface modification process using one or more polymer/oligomer surface modification compositions, able to form a hydrophobic surface film over the silanol-containing surfaces of the silica dielectric films. Thus, within these broad parameters, a surface modification composition includes one or more surface modification agents, prepared in a composition that allows for the formation of a hydrophobic coating upon contact with the surface of a silica dielectric film.

More particularly, it is contemplated that the surface modification agent is prepared from a monomer i.e., a monomer precursor, that can be induced to polymerize and cross-link with itself and/or other types of monomers present in the reaction mixture to form a surface modification reagent. The formed surface modification reagent is, for example, a mixture that includes oligomers, e.g., multimers of 100 or fewer repeat units, and/or polymers, e.g., multimers of 100 or more repeat units. This surface modification reagent is then applied to a silica dielectric film in need of such treatment where it will react with, i.e., cap, a substantial proportion of silanol groups thereon to form a desired hydrophobic coating. This surface modification reagent can be prepared from polymerization of suitable monomer(s), including organosilicon monomers able to form polymers that can react with silanols, e.g., methyltriacetoxysilane, tris(dimethlyaimino)-methylsilane, and tris(diethylamino) methylsilane.

More typically, the surface modification reagent is prepared from silicon-based monomers, e.g., siloxanes, silazanes, silanes, carbosilanes, and the like, and combinations thereof, e.g., by hydrolysis/condensation or other type of polymerization/reactions. Simply by way of example, and without limitation, one such reaction will proceed as follows.

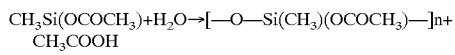

$$CH_3Si(OCOCH_3)+H_2O \rightarrow [-O-Si(CH_3)(OCOCH_3)-]n+ CH_3COOH$$

wherein "→" symbolizes the proceeding of the polymerization, in the case, hydrolysis/condensation, and "n" is an integer ranging in value from 2 to about 10,000, or greater.

The molar ratio of water to monomer in the reaction mixture is readily adjusted according to the particular products. In preferred embodiments, the water is present during the reaction in proportion to the monomer in a ratio ranging from about 0.50:1.5 to about 1.5:0.5, mole/mole.

While not wishing to be bound by any theory of hypothesis as to how the reagents of the invention operate, based on this illustrative reaction scheme, the polymeric —OCOCH$_3$ moiety is the functional group that is believed to react with silanols (Si—OH) on the porous silica surface. While it is believed that such surface modification reagents will primarily link to the surface silanols, it is also contemplated that in certain optional embodiments, a significant amount of cross-linking within the resulting hydrophobic coating will take place during formation of that coating.

Thus, one exemplary class of siloxane polymer/oligomers that have multi-functional groups that can react with silanol (Si—OH) have the following general formula

(—SiXR—O—)n                                       Formula I wherein R can be H, alkyl, or aryl group and X is, e.g., selected from one or more of the following moieties: H, acetoxy (OCOCH$_3$), enoxy (CH$_2$=C(CH$_3$)—O—Si), oxime (R$_2$C=N—Os—Si), alkoxy(RO—Si), amine(R$_2$N—Si) and/or silanol (Si—OH), and n is an integer ranging, for example, in value from 2 to about 10,000, or greater. In a further option, n is an integer ranging in value from about 2 to about 1000. It should also be understood that, in a given preparation, the sizes of the oligomers and/or polymer species formed, and therefore the value of n, will typically be distributed over a range of values.

Another general class of suitable surface modification reagents include silazane polymer/oligomers that have multi-functional group that can react with silanol (Si—OH) having the general formula:

(—SiXR$_1$—NR$_2$—)n                              Formula II wherein R$_1$ and R$_2$ are independently H, alkyl, and/or aryl, and is, e.g., selected from one or more of the following moieties: acetoxy (OCOCH$_3$), enoxy (CH$_2$=C(CH$_3$)—O—Si), oxime(R$_2$C=N—Os—Si), alkoxy(RO—Si), and amine (R$_2$N—Si), and n is defined as for formula I.

It will also be appreciated that since the backbone of silazane polymers is Si—N, this group can optionally provide additional functionality and options for derivitization and cross-linking. Suitable silazane reagents include, e.g., poly(1,2-dimethylsilazne), (1,2-dimethylsilazane)(1-methylsilazane) copolymer, and N-methylsilazane resin in toluene. These silazane polymers can be synthesized by the reaction of an appropriate amine or $NH_3$ with the desired silane reagents.

Yet another general class of suitable surface modification reagents include silane polymer/oligomers that have multi-functional group that can react with silanol (Si—OH) having the general formula:

    (—SiXR—)n         Formula III wherein R can be H, alkyl, or aryl group and X is, e.g., selected from one or more of the following moieties: H, acetoxy ($OCOCH_3$), enoxy ($CH_2$=$C(CH_3)$—O—Si), oxime($R_2C$=N—Os—Si), alkoxy(RO—Si), and amine ($R_2N$—Si), and n is defined as for formula I. It will also be appreciated that since the backbone of silane polymers is Si—Si, this group can optionally provide additional functionality and options for derivatization and cross-linking. Typical silane reagents that can be used for this application include, e.g., polydimethylsilane, polyphenylmethylsilane, and the like, as well as combinations thereof.

Another general class of suitable surface modification reagents include carbosilanes polymer/oligomers that have multi-functional group that can react with silanol (Si—OH) having the general formula:

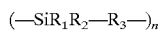
    (—$SiR_1R_2$—$R_3$—)$_n$       Formula IV

Wherein $R_1$ and $R_2$ can independently H, alkyl, aryl groups, acetoxy ($OCOCH_3$), enoxy ($CH_2$=$C(CH_3)$—O—Si), oxime($R_2C$=N—Os—Si), alkoxy(RO—Si), or amine ($R_2N$—Si), and $R_3$ can be substituted or un-substituted alkylene or arylene, Suitable siloxane polymers having multi-functional groups and silanol groups, are also commercially available. For example, the artisan will be familiar with the T-11 series of siloxane reagents available from the Advanced Microelectronic Materials division of Honeywell (formerly AlliedSignal) (Sunnyvale, Calif.). Many suitable silane and silazane polymers are also commercially available, e.g., from United Chemical Technology (Bristol, Pa.).

It is also contemplated that combinations of one or more of the above, e.g., of reagents represented by Formulas I, II, III and/or IV, in the form of polymer and/or copolymer combinations, are also usefully employed in the methods and compositions of the invention.

Preferably, the surface modification agent is the hydrolysis/condensation product of a spin-on-glass type silica reagent, e.g., methyltriacetoxysilane ("MTAS"). The hydrolysis/condensation product of MTAS has a siloxane backbone structure with acetoxy multi-functional groups, formed by mixing a suitable MTAS solution with a defined proportion of water under appropriate conditions.

Methods of Reacting Silica Dielectric Films with Surface Modification Agents

Although the exemplified methods for reacting silica films with surface modification agents are conducted in the liquid phase, the artisan will appreciate that surface modification agent or agents may be delivered into contact with the film to be treated in either a liquid phase, with or without an optional co-solvent, or in the vapor phase, with or without an optional co-solvent, as described, e.g., in co-owned Ser. No. 09/111,084, filed Jul. 7, 1998, incorporated herein by reference in its entirety, provided that the reaction is conducted with an amount or concentration of surface modification agent(s) effective to provide a treated dielectric film having the desired range of dielectric constant and mechanical strength to produce a suitable integrated circuit on the substrate.

In one embodiment of the invention, the silica film is exposed to a vapor phase material that includes a monomer for forming a polymer/oligomer surface modification agent as described herein, and optionally in combination with a carrier gas, in an amount and under conditions effective to cap silanol moieties on the film surface.

It will be appreciated that a suitable vapor phase monomer for producing a polymer/oligomer surface modification agent will exhibit a satisfactory boiling point/vapor pressure, reactivity, purity, and will yield an effective and heat stable hydrophobic surface on the treated film without causing significant undesirable effects. Monomers for forming surface modification agents desirably employed in the vapor phase will have suitable vapor pressures in the temperature range for conducting the surface modification treatment. Simply by way of example, and without limitation, the vapor pressure of a suitable monomer will range from about 1 to about 500 torr. Preferably, the vapor pressure of a suitable surface modification agent will range from about 5 to about 100 torr. More preferably, the vapor pressure of a monomer will range from about 5–100 torr. Most preferably, the vapor pressure of a monomer for forming a surface modification agent will range from about 10 to about 50 torr.

As exemplified herein, the monomer was mixed with a suitable solvent/co-solvent in liquid phase. Suitable co-solvents are those solvents in which the surface modification agent and any other optional materials are soluble, but which will not dissolve the dielectric material to be treated or interfere with the capping of the silanols on the treated surface and which can be readily removed by evaporation and/or heating after the surface modification reaction is complete. Simply by way of example, and without limitation, such co-solvents include ethers, esters, ketones, glycol ethers, chlorinated solvents, low viscosity siloxanes and suitable combinations of the members of these solvent classes. The artisan will appreciate that the term, "low viscosity" as applied to siloxanes is that which is generally understood in the art, and will preferably range from about 1 to about 100 centistokes and preferably have a molecular weight ranging from about 160 to about 3800 Daltons. Exemplary low viscosity siloxanes useful in the inventive processes are commercially available, e.g., from Dow Corning.

Suitable solvents/co-solvents can be employed in concentrations ranging generally from about 0.5 to about 99 percent, or greater, by weight of the total solution. Exemplary ethers useful in the inventive processes include diethyl ether, diisopropyl ether, dibutyl ether and combinations thereof. Exemplary ethers useful in the inventive processes include: ethyl acetate, isopropyl acetate, n-butyl acetate, and combinations thereof Exemplary hydrocarbons useful in the inventive processes include: n-hexane, n-heptane, cyclohexanes, toluene, and combinations thereof Exemplary ketones useful in the inventive processes include: acetone, 3-pentanone, methyl isobutyl ketone, and combinations thereof. Exemplary glycol ethers useful in the inventive processes include: tri(ethylene glycol) dimethyl ether, tetra (ethylene glycol) dimethyl ether, tri(propylene glycol) dimethyl ether, and combinations thereof. Exemplary chlorinated solvents useful in the inventive processes include: 1,2-dichloroethane, carbon tetrachloro, chloroform, and combinations thereof As exemplified in the examples below, 3-pentanone is a preferred co-solvent. 3-pentanone is useful in amounts ranging from about 0.5 to about 99 percent, or greater, or more preferably, in amounts ranging from about 50 to 80 percent, by weight of the total solution.

In the exemplified embodiments of the invention, the monomer was mixed with a solvent or co-solvent containing water, and the surface modification agent is a hydrolysis/condensation product formed in the presence of water. The water content of the co-solvent ranges from about 0.05 percent or greater. Preferably, the water content of the solvent or co-solvent ranges from about 0.05 percent to about 10 percent, or greater. More preferably, the water content of the solvent or co-solvent ranges from about 0.5 percent to about 4 percent.

The solution was then mixed with various defined proportions of the co-solvent solution, and applied by art-standard methods to the dielectric film on the substrate, e.g., the solution or suspension containing the hydrolysis/condensation product was spun onto various test films. The monomer is mixed with the water containing solvent/co-solvent in a concentration (monomer to co-solvent) ranging from about 5 to about 90 percent, or greater. Preferably, the concentration of the monomer in the co-solvent ranges from about 5 to about 50 percent. More preferably, the concentration of the monomer in the co-solvent ranges from about 10 to about 30 percent. The proportion of monomer to water ranges from about 0.50:1 to about 1:0.50, mole/mole. More preferably, the proportion of monomer to water ranges from about 0.75:1 to about 1:0.75. In the examples below, the monomer was exemplified by MTAS.

Thereafter, the substrate and the treated film was heated to a temperature and for a time period sufficient to drive off remaining surface modification agent and solvent. In one preferred embodiment the film is then cured. Optionally, the heating steps can be conducted in a plurality of stages, each stage utilizing similar or differing times and temperatures, or combined into a single process step. For example, the heat treatment was conducted under air at 175 and 320° C., respectively. The treated film was thereafter cured, e.g., at 400° C.

Combinations with Other Methods and Reagents—Monomer-Type Surface Modification Agents As noted above in the Background of the Invention, one previously employed method of capping silanol groups on dielectric film pore surfaces employed an organic reagent monomer, such as hexamethyldisilazane (HMDZ), that is introduced into the pores of the film and allowed to react with the surface silanol groups. This reaction caps the silanols by forming hydrophobic trimethylsilyl groups. As noted above, one disadvantage in the use of trimethylsilyl groups is that they are not very thermally stable and may out-gas during further processing of the IC, and cause via poisoning.

However, an optional embodiment of the present invention provides for a combination of this other method, i.e., capping silanor groups with monomers to produce a hydrophobic surface, with the methods and compositions of the present invention. Advantageously, a combined treatment provides additional capping of internal silanols, e.g., on film surfaces located inside the pore structure of a nanoporous film, which is believed to further reduce the film dielectric constant. Further, the oligomer or polymer surface modification agent according to the invention seals the film surface, provides added mechanical strength, improved hydrophobicity and is believed to inhibit out-gassing during IC processing.

The combined process may be conducted sequentially, by first reacting the film with a monomer-type surface modification agent, and then reacting the film with the oligomer or polymer surface modification agent of the invention. Preferably, the reactions are conducted simultaneously by (1) forming a solution of the oligomer or polymer surface modification agent and then (2) adding an additional quantity of a selected monomer agent to that solution. The combined solution is then applied to the dielectric film to be treated by the methods previously described supra.

A number of monomer-type surface modification agents and methods for producing hydrophobic, low dielectric nanoporous silica films have been described, for example, in co-owned U.S. application Ser. Nos. 60/098,068 and 09/140,855, both filed on Aug. 27, 1998, Ser. Nos. 09/234,609 and 09/235,186, both filed on Jan. 21, 1999, the disclosures of which are incorporated by reference herein in their entirety.

One preferred monomer-type surface modification agent is a compound having a formula selected from the group consisting of Formulas V (1)–(6):

(1) $R_3SiNHSiR_3$, (2) $R_xSiCl_y$, (3) $R_xSi(OH)_y$, (4) $R_3SiOSiR_3$, (5) $R_xSi(OR)_y$, and/or (6) $R_xSi(OCOCH_3)_y$ and combinations thereof, wherein x is an integer ranging from 1 to 3, y is an integer ranging from 1 to 3 such that y=4−x, p is an integer ranging from 2 to 3; each R is an independently selected from hydrogen and a hydrophobic organic moiety. The R groups are preferably independently selected from the group of organic moieties consisting of alkyl, aryl and combinations thereof. The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the monomer-type surface modification agent is an acetoxysilane such as, acetoxytrimethylsilane, diacetoxydimethylsilane, methyltriacetoxysilane, phenyltriacetoxysilane, diphenyldiacetoxysilane, and/or an alkoxysilane such as, trimethylethoxysilane, trimethylmethoxysilane, 2-trimethylsiloxypent-2-ene4-one, n-(trimethylsilyl)acetamide, and/or one or more of the following: 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof The monomer-type surface modification agent may be mixed with a suitable solvent such as acetone, applied to the nanoporous silica surface in the form of a vapor or liquid, and then dried.

Additional monomer-type surface modification agents include multifunctional surface modification agents as described in detail in co-owned U.S. Ser. No. 09/235,186, incorporated by reference herein in its entirety, as described above. Such multifunctional surface modification agents can be applied in either vapor or liquid form, optionally with or without co-solvents. Suitable co-solvents include, e.g., ketones, such as acetone, 3-pentanone, diisolpropylketon, and others, as described in detail in co-owned U.S. application Ser. No. 09/111,084, filed on Jul. 7, 1998, the disclosure of which in incorporated by reference herein in its entirety. For example, as described in detail in U.S. Ser. No. 09/235,186, as incorporated by reference above, certain preferred surface modification agents will have two or more functional groups and react with surface silanol functional groups while minimizing mass present outside the structural framework of the film, and include, e.g., suitable silanols such as $R_1Si(OR_2)_3$ Formula VI wherein $R_1$ and $R_2$ are independently selected moieties, such as H and/or an organic moiety such as an alkyl, aryl or derivatives of these. When $R_1$ or $R_2$ is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When $R_1$ or $R_2$ is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, $R_1$ or $R_2$ are independently selected from H, methyl, ethyl, propyl, phenyl, and/or derivatives thereof, provided that at least one of $R_1$ or $R_2$ is organic. In one embodiment, both $R_1$ and $R_2$ are methyl, and a trifunctional surface modification agent according to Formula VI is methyltrimethoxysilane.

In another embodiment, a suitable silane according to the invention has the general formula of $$R_1Si(NR_2R_3)_3 \qquad \text{Formula VII}$$

Wherein $R_1$, $R_2$, $R_3$ are independently H, alkyl and/or aryl. When any of $R_1$, $R_2$, $R_3$ are alkyl and/or aryl, they are defined as for $R_1$ and $R_2$ of Formula VI, above. In preferred embodiments according to Formula VII, $R_1$ is selected from H, $CH_3$, $C_6H_5$, and $R_2$ and $R_3$ are both $CH_3$. Thus trifunctional monomer-type surface modification agents according to Formula VI include, e.g., tris(dimethylamino) methylsilane, tris(dimethylamino)phenylsilane, and/or tris(dimethylamino)silane.

In yet another embodiment, a suitable silane according to the invention has the general formula of $$R_1Si(ON=CR_2R_3)_3 \qquad \text{Formula VIII}$$

wherein $R_1$, $R_2$, $R_3$ are independently H, alkyl and/or aryl. When any of $R_1$, $R_2$, $R_3$ are alkyl and/or aryl, they are defined as for $R_1$ and $R_2$ of Formula VI, above. In one preferred embodiment, $R_1$ and $R_2$ are both $CH_3$, and $R_3$ is $CH_2CH_3$. Thus trifunctional monomer-type surface modification agents according to Formula VII include, e.g., methyltris(methylethylkeoxime)silane.

In yet a further embodiment, a suitable silane according to the invention has the general formula of $$R_1SiCl_3 \qquad \text{Formula IX}$$

wherein $R_1$ is H, alkyl or aryl. When $R_1$ is alkyl and/or aryl, they are defined as for Formula IV, above. In one preferred embodiment, $R_1$ is $CH_3$. Thus trifunctional monomer-type surface modification agents according to Formula VIII include, e.g., methyltrichlorosilane.

In a more preferred embodiment, the capping reagent includes one or more organoacetoxysilanes which have the following general formula, $$(R_1)_xSi(OCOR_2)_y \qquad \text{Formula X}$$

Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof Properties of Produced Nanoporous Dielectric Films Nanoporous silica films formed on a substrate for use according to the invention are generally formed with a porosity of about 20% or greater and with pore sizes that range from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^3$, more preferably from about 0.25 to about 1.6 $g/cm^3$, and most preferably from about 0.4 to about 1.2 $g/cm^2$.

Thus, the nanoporous silica films produced by the processes of the invention preferably have a moisture stable dielectric constant that is less than about 3. More preferably, the nanoporous silica films of the invention have a dielectric constant ranging from about 1.1 to about 3.0, even more preferably from about 1.3 to about 2.5, and most preferably from about 1.7 to about 2.

Non-Porous Silica Dielectric Films

In a further beneficial result of the present invention, it will be appreciated that the above-described methods and compositions can be optionally applied to non-porous silica dielectric materials, in order to, e.g., stabilize such materials against the effects of environmental moisture and the like, for use as insulators and dielectrics in microelectronic and/or integrated circuit products, as may be desired, for utilities where a very low dielectric constant and/or porosity is not required. Such non-porous silica-based dielectric materials include, for example, films deposited by art-standard methods, e.g., chemical vapor deposition ("CVD"), dip coating, spray coating, or any other similar materials that have surface silanols which it is desirable to cap.

Preferably, such silica dielectric materials are formed by CVD. However, the produced film tends to have free silanols on the surface that will adsorb environmental moisture. Thus, application of the methods of the present invention will usefully cap these free silanols, even on non-porous dielectric silica materials.

The following non-limiting examples serve to further explain and illustrate the invention.

EXAMPLE 1

This example illustrates the preparation of dielectric films treated with a 25% solution of MTAS-derived siloxane polymer, that contained an average of 1.5 reactive functional group per repeating unit.

Preparation of Hydrolyzed MTAS for Surface Modification

Methyltriacetoxysilane ("MTAS"; purchased from United Chemical Technologies, Bristol, Pa.) was purified by vacuum distillation prior to use. 3-pentanone(Pacific Pac) with a low water content (<250 PPM) was employed. 116 g of 3-pentanone was added to 1.78 g of water in a 500 mL flask with a magnetic stir bar. Then 29 g of MTAS was added to the above 3-pentanone/water mixture with proper stirring, which was continued overnight at room temperature to produce a clear, colorless solution. Gas chromatography-mass spectroscopy was used to analyze this product and found no sign of MTAS presence in the product, suggesting that all of the MTAS has reacted. This solution was then filtered through 0.2 micron Teflon® filter and used for the surface treatment described below.

Preparation of Nanoporous Film

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. The solution was heated to about 80° C. with vigorous stirring (heating and stirring were begun at the same time) and refluxed for 1.5 hours, to form a clear solution. The resulting solution was allowed to cool down to room temperature and then it was diluted 25% by weight with ethanol, and filtered through a 0.1 micron Teflon® filter.

About 2 mL of the nanoporous silica precursor, was deposited onto a 4" silicon wafer and then spun at 2500 rpm for 30 seconds. Then the resulting film was gelled/aged in a vacuum chamber as follows.

1. The chamber was evacuated to 250 torr.
2. 15M ammonium hydroxide was heated and equilibrated at 45° C. and introduced into the chamber to increase the pressure to 660 torr for 10 minutes
3. The chamber was refilled with air and the film was removed from the chamber for next step surface treatment/solvent exchange.

Oligomer/Polymer Treatment of Film Surface

The surface treatment/solvent exchange of the film was carried out using the following conditions:

1. The reagent used for the surface treatment was prepared as described above.
2. The aged film was put on the spinning chuck and spun at 250 rpm.
3. About 30 mL of the above MTAS solution was spun on the film without allowing the film to dry for 20 seconds.
4. Then the film was spun dry at 2500 rpm for 10 seconds, and then the film was removed from the chuck and subjected to heat treatment.

Heat Treatment

The film obtained from the above process was then heated at 175 and 320° C., under air, for two 60 second steps, respectively. Then the film was cured in a furnace at 400° C. for 30 minutes under nitrogen.

The refractive index and thickness of the obtained films were measured by Woollam ellipsometer by standard methods.

Determination of Dielectric Constant

The dielectric constant was measured by the standard CV curve technique, using MOS capacitor ("MOSCAP") structure as follows. The MOSCAP structure is formed by sputtering aluminum onto the film through a circular dot mask and an aluminum blanket film is also sputtered onto the back side of the wafer. An appropriately biased voltage was applied to the MOSCAP and the capacitance was then measured at 1 MHz. This method was employed for dielectric constant determinations in all subsequent examples.

Determination of Film Mechanical Strength

The force required to break the film was determined by an art-standard stud-pull test. The film to be tested was placed on substrate wafer, and an aluminum layer was placed on top of the film to prevent penetration of the pore structure by the subsequently applied epoxy. An epoxy test stud was then epoxied to the top of the aluminized film. Once the epoxy was cured, the stud was pulled away from the film, with a measured force, until some component broke. The measured pull force at the moment just prior to breakage was reported as the stud pull strength. As described below and in the following examples, the stud-pull is defined as the force exerted on the workpiece, at the moment of mechanical failure, measured in kilopounds per square inch ("KPSI").

The measured film properties are summarized in the following table.

TABLE 1

| Refractive Index | Film Thickness (Å) | Dielectric constant | Stud pull (KPSI) |
|---|---|---|---|
| 1.221 | 7206 | 2.23 | 2.54 |

EXAMPLE 2

This example illustrates preparation of dielectric films treated with a 30% solution of MTAS-derived siloxane polymer that contained 1 reactive functional group per repeating unit.

Preparation of Hydrolyzed MTAS for Surface Modification

MTAS and 3-pentanone were obtained and prepared as for Example 1, above. 76.3 g of 3-pentanone was added to 2.67 g of water in a 250 mL flask with magnetic stir bar. Then 32.7 g of MTAS was added to the above 3-pentanone/water mixture with proper stirring, which was continued overnight at room temperature to produce a clear, colorless solution. Gas chromatography-mass spectroscopy was used to analyze this product and found no sign of MTAS presence in the product suggesting all of the MTAS has reacted. This solution was then filtered through a 0.2 micron Teflon® filter and used for surface treatment described below.

Preparation of Nanoporous Film

About 2 mL of a nanoporous silica precursor prepared as described in Example 1, above, was deposited onto a 4" silicon wafer and then spun at 2500 rpm for 30 seconds. Then the film was gelled/aged in a vacuum chamber using the three-step method described above for Example 1.

The surface treatment/solvent exchange of the film was carried with the above-described surface modification reagent using the four-step process described by Example 1.

The film obtained from the above process was then heated in the two-step process, and cured under nitrogen gas, as described above for Example 1. The refractive index, dielectric constant and stud pull test were all conducted as for Example 1. The measured film properties are shown in the following table.

TABLE 2

| Refractive Index | Film Thickness (Å) | Dielectric constant | Stud pull (KPSI) |
|---|---|---|---|
| 1.3144 | 6115 | 3.13 | 3.96 |

EXAMPLE 3

This example illustrates preparation of dielectric films treated with a 20% solution of MTAS-derived siloxane polymer that contained 1 reactive functional group per repeating unit.

Preparation of Hydrolyzed MTAS for Surface Modification

MTAS and 3-pentanone were obtained and prepared as for Example 1, above. 122 g of 3-pentanone was added to 2.5 g of water in a 500 mL flask with magnetic stir bar. Then 30.5 g of MTAS was added to the above 3-pentanone/water mixture with proper stirring, which was continued overnight at room temperature to produce a clear, colorless solution. Gas chromatography-mass spectroscopy was used to analyze this product and found no sign of MTAS presence in the product suggesting all of the MTAS has reacted. This solution was then filtered through a 0.2 micron Teflon® filter and used for surface treatment described below.

Preparation of Nanoporous Film

About 2 mL of a nanoporous silica precursor prepared as described in Example 1, above, was deposited onto a 4" silicon wafer and then spun at 2500 rpm for 30 seconds. Then the film was gelled/aged in a vacuum chamber using the three-step method described above for Example 1.

The surface treatment/solvent exchange of the film was carried with the above-described surface modification reagent using the four-step process described by Example 1.

The film obtained from the above process was then heated in the two-step process, and cured under nitrogen gas, as described above for Example 1. The refractive index, dielectric constant and stud pull test were all conducted as described for Example 1. The measured film properties are shown in the following table.

TABLE 3

| Refractive Index | Film Thickness (Å) | Dielectric constant | Stud pull (KPSI) |
|---|---|---|---|
| 1.2329 | 6390 | 2.18 | 2.21 |

EXAMPLE 4

This example illustrates preparation of dielectric films treated with a 10% solution of MTAS-derived siloxane polymer that contained 1 reactive functional group per repeating unit.

Preparation of Hydrolyzed MTAS for Surface Modification

MTAS and 3-pentanone were obtained and prepared as for Example 1, above. 185.4 g of 3-pentanone was added to 1.68 g of water in a 500 mL flask with magnetic stir bar: Then 20:6 g of MTAS was added to the above 3-pentanone/water mixture with proper stirring, which was continued overnight at room temperature to produce a clear, colorless solution. Gas chromatography-mass spectroscopy was used to analyze this product and found no sign of MTAS presence in the product, suggesting all of the MTAS has reacted. This solution was then filtered through a 0.2 micron Teflon® filter and used for surface treatment described below.

Preparation of Nanoporous Film

About 2 mL of a nanoporous silica precursor prepared as described in Example 1, above, was deposited onto a 4" silicon wafer and then spun at 2500 rpm for 30 seconds. Then the film was gelled/aged in a vacuum chamber using the three-step method described above for Example 1.

The surface treatment/solvent exchange of the film was carried with the above-described surface modification reagent using the four-step process described by Example 1.

The film obtained from the above process was then heated in the two-step process, and cured under nitrogen gas, as described above for Example 1. The refractive index, dielectric constant and stud pull test were all conducted as described for Example 1. The measured film properties are shown in the following table.

TABLE 4

| Refractive Index | Film Thickness (Å) | Dielectric constant | Stud pull (KPSI) |
|---|---|---|---|
| 1.1933 | 5871 | 2.49 | 1.70 |

EXAMPLE 5

This example illustrates preparation of dielectric films treated with a 10% solution of MTAS-derived siloxane polymer that contained 1.5 reactive functional group per repeating unit.

Preparation of Hydrolyzed MTAS for Surface Modification

MTAS and 3-pentanone were obtained and prepared as for Example 1, above. 223.2 g of 3-pentanone was added to 1.52 g of water in a 500 mL flask with a magnetic stir bar. Then 24.8 g of MTAS was added to the above 3-pentanone/water mixture with proper stirring, which was continued overnight at room temperature to produce a clear, colorless solution. Gas chromatography-mass spectroscopy was used to analyze this product and found no sign of MTAS presence in the product, suggesting all of the MTAS has reacted. This solution was then filtered through a 0.2 micron Teflon® filter and used for surface treatment described below.

Preparation of Nanoporous Film

About 2 mL of a nanoporous silica precursor prepared as described in Example 1, above, was deposited onto a 4" silicon wafer and then spun at 2500 rpm for 30 seconds. Then the film was gelled/aged in a vacuum chamber using the three-step method described above for Example 1.

The surface treatment/solvent exchange of the film was carried with the above-described surface modification reagent using the four-step process described by Example 1.

The film obtained from the above process was then heated in the two-step process, and cured under nitrogen gas, as described above for Example 1. The refractive index, dielectric constant and stud pull test were all conducted as described for Example 1. The measured film properties are shown in the following table.

TABLE 5

| Refractive Index | Film Thickness (Å) | Dielectric constant | Stud pull (KPSI) |
|---|---|---|---|
| 1.1766 | 6694 | 2.25 | 1.54 |

EXAMPLE 6

This example is provided for comparison purposes and illustrates preparation of dielectric films treated only with MTAS monomer. No polymer/oligomer was applied to these films.

Preparation of Nanoporous Film

About 2 mL of a nanoporous silica precursor prepared as described in Example 1, above, was deposited onto a 4" silicon wafer and then spun at 2500 rpm for 30 seconds. Then the film was gelled/aged in a vacuum chamber using the three-step method described above for Example 1.

The surface treatment/solvent exchange of the film was conducted according to the method of Example 1, but the reagent used for the surface modification was prepared by mixing 5 grams of MTAS with 95 grams of 3-pentanone (each obtained as described by Example 1) to form a clear colorless solution.

The film obtained from the above process was then heated in the two-step process, and cured under nitrogen gas, as described above for Example 1. The refractive index, dielectric constant and stud pull test were all conducted as described for Example 1. The measured film properties are shown in the following table.

TABLE 6

| Refractive Index | Film Thickness (Å) | Dielectric constant | Stud pull (KPSI) |
|---|---|---|---|
| 1.1665 | 7518 | 1.98 | 1.5 |

EXAMPLE 7

This example illustrates preparation of dielectric films treated with a (monomer) silylation surface reagent followed by treatment with a 25% solution of MTAS-derived siloxane polymer that contained an average of 1.5 reactive functional group per repeating unit.

Preparation of Hydrolyzed MTAS for Surface Modification

MTAS and 3-pentanone were obtained and prepared as for Example 1, above. 50 g of MTAS was dissolved in 150 g of 3-pentanone. 3.05 gram of water was then added to the above solution with proper stirring. The resulted clear colorless solution that included hydrolyzed MTAS was filtered through 0.2 micron filter prior to use for surface treatment.

Preparation of Nanoporous Film

About 4 mL of a nanoporous silica precursor prepared as described in Example 1, above, was deposited onto a 8" silicon wafer and then spun at 2500 rpm for 30 seconds. The spun film was gelled/aged in a vacuum chamber using the following conditions:

1. The chamber was evacuated to 250 torr.
2. 15M ammonium hydroxide was heated and equilibrated at 45° C. and introduced into the chamber to increase the pressure to 660 torr for 5 minutes.
3. The chamber was evacuated to 250 torr.
4. 15M ammonium hydroxide was heated and equilibrated at 45° C. and introduced into the chamber to increase the pressure to 660 torr for 5 minutes.
5. The chamber was refilled with air and the aged film was removed from the chamber.

Conventional Surface Modification for Silylating Pore Surfaces

The aged film was then subjected to surface treatment/solvent exchange. The solution used for surface treatment/solvent exchange was prepared by dissolving MTAS, prepared and distilled as described by Example 1, in 3-pentanone to make a 5 wt. % MTAS concentration in 3-pentanone. The surface treatment/solvent exchange of the film was carried out using the following conditions:
1. The aged film was put on the spinning chuck and spun at 250 rpm.
2. About 30 mL of the above MTAS solution was spun onto the film, without allowing the film to dry, for 20 seconds.
3. Then the film was spun dry at 2500 rpm for 10 second, removed from the chuck, and subjected to heat treatment at 175 and 320° C., under air, for 60 seconds respectively, to produce a baked film.

Polymer/oligomer Surface Treatment

The baked film resulting from step 3 of the above procedure was then treated with the hydrolyzed MTAS solution described The surface treatment/solvent exchange of the film was carried out using the following conditions:
1. The baked film obtained from the above process was put on the spinning chuck and spun at 250 rpm.
2. About 30 mL of the above described hydrolyzed MTAS solution was spun on the film without allowing the film to dry for 20 seconds.
3. Then the film was spun dry at 2500 rpm for 10 second and then the film was removed from the chuck and subjected to heat treatment.

The film obtained from the above process was then heated at 175 and 320° C. under air for 60 seconds, respectively. Then it was cured in a furnace at 400° C. for 30 minute under nitrogen. Refractive index and thickness of the obtained film was measured by a Woollam ellipsometer.

Dielectric Constant Measurement

Dielectric constant was measured by the standard CV curve technique, as described by Example 1, supra.

Film Mechanical Strength Measurement

The cohesive strength of the film was measured by a stud pull test, as described by Example 1, supra.

The modulus of the prepared films was measured with Nano Indenter XP (MTS Systems Corp., Oak Ridge, Tenn. 37830). This measurement provides the modulus of the films in GPa ($10^6$ N/m$^2$).

TABLE 7

| | Refractive Index | Film Thickness (Å) | Dielectric Constant | Cohesive Strength (KPSI) | Modulus (GPa) |
|---|---|---|---|---|---|
| Ex. 7 Data Multi-function-Polymer | 1.2565 | 7823 | 2.4 | 8.3 | 6.3 |
| Ex. 6 Data Treated by MTAS without H$_2$O monomer | 1.1665 | 7518 | 1.98 | 1.5 | N/A |

As can be appreciated from Table 7, above, the properties of the film treated by the exemplified multifunctional polymer/oligomer compares are improved relative to the properties of the film treated with just MTAS monomer. In particular, there is a greater than 5-fold increase in the cohesive strength, combined with a relatively modest increase in the dielectric constant.

EXAMPLE 8

This example illustrates preparation of dielectric films treated with a solution that contained both a 5% monomeric silylation reagent (MTAS monomer) and a 25% MTAS-derived siloxane polymer that contained an average of 1.5 reactive functional groups per repeating unit.

Preparation of Hydrolyzed MTAS for Surface Modification

MTAS and 3-pentanone were obtained and prepared as for Example 1, above. 250 g MTAS was mixed with 750 g 3-pentanone and then 15.3 g water was added while the solution was properly stirred. The solution was then stirred overnight. 15.4 g of MTAS was added to 185 g of clear solution obtained from previous step. The resulting clear colorless solution was filtered through a 0.2 micron filter prior to use for surface treatment.

Preparation of Nanoporous Film

A nanoporous silica precursor was synthesized, spin-deposited onto a 8" silicon wafer and then gelled/aged in a vacuum chamber as described by Example 7, supra.

Polymer/oligomer Surface Treatment

The resulting aged film was then treated with the hydrolyzed MTAS polymer. solution, which also included monomer MTAS, as described above.

The surface treatment/solvent exchange of the film was carried out using the following conditions:
1. The aged film obtained from the above process was put on the spinning chuck and spun at 250 rpm.
2. About 30 mL of the above hydrolyzed MTAS solution was spun on the film without allowing the film to dry for 20 seconds.
3. Then the film was spun dry at 2500 rpm for 10 second and then the film was removed from the chuck and subjected to heat treatment.

The film obtained from the above process was then heated at 175 and 320° C. under air for 60 seconds respectively. Then it was cured in a furnace at 400° C. for 30 minute under nitrogen. Refractive index and thickness of the obtained film was measured by Woollam ellipsometer.

TABLE 8

| Refractive Index | Film Thickness (Å) | Dielectric Constant | Cohesive Strength (KPSI) |
|---|---|---|---|
| 1.3054 | 6898 | 2.38 | 8.27 |

This process demonstrated a simplified co-treatment process (compared to Example 7) with both silylation of surface silanols by MTAS monomer and by the hydrolyzed MTAS polymer composition. The result is a film with physical properties (dielectric constant, cohesive strength) similar to those obtained by the process of Example 8.

EXAMPLE 9

This example illustrates preparation of dielectric films treated with a silylation reagent (MTAS monomer) followed by treatment with a 25% solution of MTAS-derived siloxane polymer that contained an average of 1.5 reactive functional group per repeating unit.

Preparation of Hydrolyzed MTAS for Surface Modification 250 g MTAS was mixed with 750 g 3-pentanone and then 15.3 g water was added while the solution was properly stirred. The solution was then stirred overnight. The resulting clear colorless solution was filtered through 0.2 micron filter prior to use for surface treatment.

Preparation of Nanoporous Film

A nanoporous silica precursor was synthesized, spin-deposited onto a 8" silicon wafer and then gelled/aged in a vacuum chamber as described by Example 7, supra.

Polymer/oligomer Surface Treatment

The surface treatment/solvent exchange of the film was carried out using the hydrolyzed MTAS polymer composition of this example applied using the process as described above for Example 8.

The film obtained from the above process was then heated at 175 and 320 C. under air for 60 seconds respectively. Then it was cured in a furnace at 400C. for 30 minute under nitrogen. Refractive index and thickness of the obtained film was measured by Woollam ellipsometer, as described above in Example 1.

TABLE 9

| Refractive Index | Film Thickness (Å) | Dielectric Constant | Cohesive Strength (KPSI) |
|---|---|---|---|
| 1.2826 | 6439 | 2.15 | 8.29 |

This process demonstrated a simplified process (compared to example 8) and provide films with similar physical properties (dielectric constant, cohesive strength).

While there have been described what are presently believed to be the preferred embodiments of the invention, those skilled in the art will realize that changes and modifications may be made thereto without departing from the spirit of the invention. It is intended to claim all such changes and modifications that fall within the true scope of the invention. Numerous references are cited in the specification, the disclosures of which are incorporated by reference in their entireties.

What is claimed is:

1. A process for treating a silica film on a substrate, which comprises reacting a suitable silica film with a composition comprising a surface modification agent, wherein said silica film is present on a substrate and wherein said reaction is conducted under conditions and for a period of time sufficient for said surface modification agent to form a hydrophobic coating on said film and said surface modification agent comprises at least one type of oligomer or polymer reactive with silanols on said silica film.

2. The process of claim 1 wherein said reaction is conducted in the presence of at least one solvent or co-solvent.

3. The process of claim 1 wherein said silica film is a nanoporous dielectric film having a pore structure that comprises silanols, and wherein said reaction is conducted for a period of time sufficient for said surface modification agent to produce a treated nanoporous silica film having a dielectric constant of about 3 or less.

4. The process of claim 3 that produces a nanoporous silica film having a dielectric constant ranging from about 1.1 to about 3.0.

5. The process of claim 1 wherein said reaction is conducted at a temperature ranging from about 10° C. to about 300° C.

6. The process of claim 1 wherein said reaction is conducted for a time period ranging from about 10 seconds to about 1 hour.

7. The process of claim 1 wherein said surface modification agent is a polymer or oligomer that comprises functional groups that will react with silanols.

8. The process of claim 7 wherein said surface modification agent is prepared by reacting a suitable monomer with water in a solvent to form said surface modification agent.

9. The process of claim 2 wherein said solvent or co-solvent is selected from the group consisting of ethers, esters, ketones, glycol ethers, hydrocarbons, chlorinated solvents, low viscosity siloxanes and combinations thereof.

10. The process of claim 2 wherein said co-solvent is selected from the group consisting of ethers, esters, ketones, glycol ethers, hydrocarbons, chlorinated solvents, low viscosity siloxanes and combinations thereof.

11. The process of claim 8 wherein said monomer is selected from the group consisting of a siloxane, a silazane, a silane, a carbosilane, and combinations thereof.

12. The process of claim 8 wherein said water is present in said co-solvent in a concentration ranging from about 0.05 to about 10 percent, by weight, relative to the co-solvent.

13. The process of claim 8 wherein said water is present during said reaction in proportion to said monomer in a ratio ranging from about 0.50:1.5 to about 1.5:0.5, mole/mole.

14. The process of claim 8 wherein said monomer compound is selected from the group consisting of said monomer compound is selected from the group consisting of methyltriacetoxysilane, phenyltriacetoxysilane, tris(dimethlyaimino)methylsilane, tris(dimethylamino)phenylsilane, tris(diethylamino)methylsilane and combinations thereof.

15. The process of claim 1 wherein the composition comprises an oligomer or polymer surface modification agent and a monomer surface modification agent, wherein said monomer is reactive with silanol groups on said silica film.

16. The process of claim 1 wherein said silica film is pre-treated with a monomer surface modification agent, wherein said monomer is reactive with silanol groups on said silica film.

17. The process of claim 8 further comprising adding at least one additional monomer to said solution after the water is fully reacted, wherein said monomer is reactive with silanol groups on said silica film.

18. The process of claim 15 wherein the monomer surface modification agent is selected from the group consisting of siloxanes, silazanes, silanes, carbosilanes and combinations thereof.

19. The process of claim 15 wherein the monomer surface modification agent is selected from the group consisting of acetoxytrimethylsilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene4-one, n-(trimethylsilyl)acetaride, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol, tris(dimethylamino)methylsilane, tris(dimethylamino)phenylsilane, tris(dimethylamino)silanemethyltrimethoxysilane, methyltris(methylethylkeoxime)silane methyltrichlorosilane, and combinations thereof.

* * * * *